(12) United States Patent
Kim et al.

(10) Patent No.: US 10,506,187 B2
(45) Date of Patent: Dec. 10, 2019

(54) IMAGE SENSOR HAVING DUAL MICROLENSES FOR EACH AUTO-FOCUS (AF) PIXEL

(71) Applicants: SK hynix Inc., Gyeonggi-do (KR); DONG-A UNIVERSITY RESEARCH FOUNDATION FOR INDUSTRY-ACADEMY COOPERATION, Busan (KR)

(72) Inventors: Yun Kyung Kim, Busan (KR); Kyoung In Lee, Gyeonggi-do (KR); Youngwoong Do, Gyeonggi-do (KR); Min Su Cho, Gyeonggi-do (KR); Sung Wook Cho, Gyeonggi-do (KR)

(73) Assignees: SK hynix Inc., Gyeonggi-do (KR); Dong-A University Research Foundation For Industry-Academy Cooperation, Busan (KR)

( * ) Notice: Subject to any disclaimer, the term of this patent is extended or adjusted under 35 U.S.C. 154(b) by 0 days.

(21) Appl. No.: 16/000,315

(22) Filed: Jun. 5, 2018

(65) Prior Publication Data
US 2019/0297291 A1    Sep. 26, 2019

(30) Foreign Application Priority Data

Mar. 20, 2018   (KR) .......................... 10-2018-0031787

(51) Int. Cl.
| | | |
|---|---|---|
| *H04N 5/374* | (2011.01) | |
| *G02B 7/09* | (2006.01) | |
| *H04N 5/232* | (2006.01) | |
| *H04M 1/02* | (2006.01) | |
| *G02B 5/20* | (2006.01) | |

(52) U.S. Cl.
CPC ............. *H04N 5/374* (2013.01); *G02B 5/20* (2013.01); *G02B 7/09* (2013.01); *H04M 1/0264* (2013.01); *H04N 5/23212* (2013.01); *H04N 5/23229* (2013.01)

(58) Field of Classification Search
CPC .. H04N 5/374; H04N 5/23214; H04N 5/2322; H04N 5/23229; H04N 5/23212; G02B 5/20; G02B 7/09; H04M 1/0624
See application file for complete search history.

(56) References Cited

U.S. PATENT DOCUMENTS

| | | | | |
|---|---|---|---|---|
| 9,231,005 | B2 * | 1/2016 | Meynants | H01L 27/14605 |
| 2009/0244347 | A1 * | 10/2009 | Vaillant | H01L 27/14627 |
| | | | | 348/308 |
| 2012/0043634 | A1 * | 2/2012 | Kurihara | G02B 3/0018 |
| | | | | 257/432 |
| 2014/0078349 | A1 * | 3/2014 | Velichko | H04N 5/357 |
| | | | | 348/241 |
| 2014/0306360 | A1 * | 10/2014 | Li | B05D 1/005 |
| | | | | 264/1.7 |

FOREIGN PATENT DOCUMENTS

| | | |
|---|---|---|
| KR | 1020160000044 | 1/2016 |
| KR | 1020170019542 | 2/2017 |
| KR | 101773168 | 9/2017 |

* cited by examiner

*Primary Examiner* — Luong T Nguyen
(74) *Attorney, Agent, or Firm* — IP & T Group LLP

(57) ABSTRACT

An image sensor includes a pixel array in which auto-focus (AF) pixels and image capture pixels are arranged. Wherein at least one of the AF pixels comprises: a color filter layer; and first and second microlenses arranged over the color filter layer, and formed in a region of the at least one AF pixel in a widthwise direction of the color filter layer.

19 Claims, 5 Drawing Sheets

| Direction of light | Structure | | Incident angle | Average CT | |
|---|---|---|---|---|---|
| X axis | Wgrid only | Dual lens | SUM | 20.9% | |
| | | | 0 deg. | 3.4% | |
| | | Metal shield | SUM | 25.0% | |
| | | | 0 deg. | 3.9% | 4.1% Improved |
| | Wgrid+DTI | Dual lens | SUM | 12.9% | |
| | | | 0 deg. | 2.4% | |
| | | Metal shield | SUM | 13.0% | |
| | | | 0 deg. | 2.6% | |
| Y axis | Wgrid only | Dual lens | SUM | 21.5% | |
| | | | 0 deg. | 3.3% | |
| | | Metal shield | SUM | 26.2% | |
| | | | 0 deg. | 4.1% | 4.7% Improved |
| | Wgrid+DTI | Dual lens | SUM | 12.6% | |
| | | | 0 deg. | 2.4% | |
| | | Metal shield | SUM | 13.3% | |
| | | | 0 deg. | 2.5% | |

IMAGE SENSOR HAVING DUAL MICROLENSES FOR EACH AUTO-FOCUS (AF) PIXEL

CROSS-REFERENCE TO RELATED APPLICATION

This application claims priority under 35 U.S.C. § 119 to Korean Patent Application No. 10-2018-0031787, filed on Mar. 20, 2018, which is incorporated herein by reference in its entirety.

BACKGROUND

1. Field

Various embodiments of the present invention generally relate to an image sensor. Particularly, the embodiments relate to an image sensor having auto focus (AF) pixels for phase detection.

2. Discussion of the Related Art

An image sensor converts incident light into an electrical signal.

A complementary metal-oxide semiconductor (CMOS) image sensor having a small size and low power consumption is employed in various electronic devices such as a smart phone with a camera module.

Such an image sensor may include phase detection auto focus (PDAF) pixels. The PDAF represents a technology that detects a phase difference between a pair of PDAF pixels, decides the position of an imaging lens, and adjusts the focus of an object.

The PDAF pixels according to the related art include a metal shield for shielding the pixels from light by blocking half of the pixel area. Recently, a high-resolution camera module has been employed in various electronic devices such as smart phones. Thus, the pixel size of the image sensor has been gradually reduced.

However, the PDAF pixels of the image sensor according to the related art are difficult to apply to pixels with a small light receiving area, because light loss is caused by the metal shield. Furthermore, crosstalk caused by reflection or diffraction in the metal shield may deteriorate the pixels.

Therefore, when the image sensor according to the related art is employed in a high-resolution camera module, the image sensor may not detect an accurate phase signal.

SUMMARY

Various embodiments are directed to an image sensor capable of detecting a reliable phase by reducing optical loss, thereby raising auto-focus (AF) success rate.

In an embodiment, there is provided an image sensor comprising a pixel array in which auto-focus (AF) pixels and image capture pixels are arranged, wherein at least one of the AF pixels comprises: a color filter layer; and first and second microlenses arranged over the color filter layer, and formed in a region of the at least one AF pixel in a widthwise direction of the color filter layer.

In an embodiment, there is provided an image sensor comprising a pixel array in which AF pixels and image capture pixels are arranged, wherein at least one of the AF pixels comprises: a color filter layer; and a receiving layer and a microlens arranged over the color filter layer, and formed in a region of the at least one AF pixel in the widthwise direction of the color filter layer.

In an embodiment, there is provided An image sensor comprising a pixel array in which auto-focus (AF) pixels and image capture pixels are arranged, wherein at least one of the AF pixels comprises: a color filter layer; and first and second light-incident layers arranged over the color filter layer, wherein the first and second light-incident layers have different heights and different widths.

DETAILED DESCRIPTION

Figure 1:
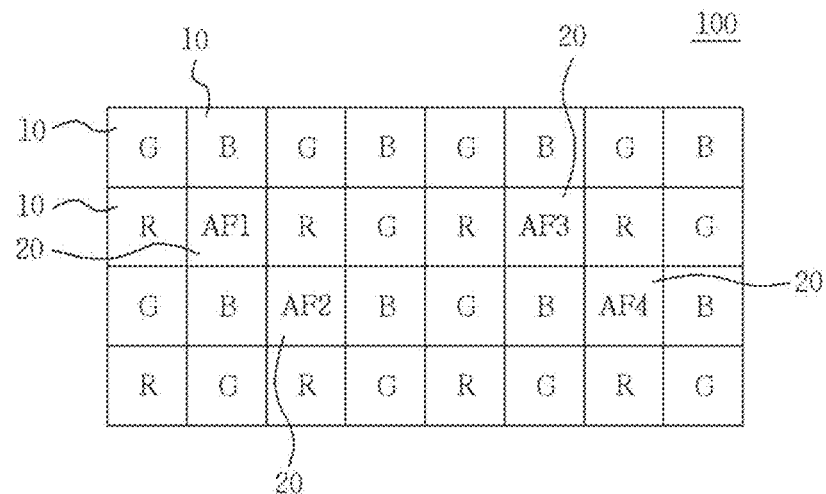
FIG. 1 illustrates an array of pixels in an image sensor in accordance with an embodiment.

Various embodiments will be described below in more detail with reference to the accompanying drawings such that the present invention can be easily practiced by those skilled in the art to which the present invention pertains. Throughout the disclosure, like reference numerals refer to like parts throughout the various figures and embodiments of the present invention. It is further noted that reference to "an embodiment" is not necessarily to only one embodiment, and different references to "an embodiment" are not necessarily to the same embodiment(s).

Moreover, in the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

The terminology used herein is for the purpose of describing particular embodiments only and is not intended to be limiting of the present invention.

As used herein, singular forms may include the plural forms as well, unless the context clearly indicates otherwise.

Hereinafter, an image sensor of a digital image processor for controlling focus using a phase difference of incident light will be described in detail with reference to the attached drawings.

FIG. 1 illustrates an array of pixels in an image sensor 100 in accordance with an embodiment.

Referring to FIG. 1, the image sensor 100 may include an array of pixels, which may include image capture pixels 10 and auto focus (AF) pixels 20. The image capture pixels 10 may include red (R), green (G) and blue (B) pixels for capturing an image. The AF pixels 20 used for detecting a phase difference may include one or more pairs of AF pixels, for example, pair AF1 and AF2, and pair AF3 and AF4.

FIG. 1 illustrates some of the pixels of the image sensor 100. The number of pixels or any subset thereof, e.g., image capture pixels 10 or AF pixels 20, is not limited to the numbers shown in FIG. 1. The numbers may vary depending on the particular image sensor 100 and its application(s). The image sensor 100 illustrated in FIG. 1 has a structure in which the AF pixels 20 are applied to green pixels, i.e., pixels having green filters, each of which is diagonally adjacent to at least one AF pixel 20. However, the present embodiment is not limited to this configuration and application. Rather, the AF pixels 20 may be applied to pixels having red or blue filters, i.e., red or blue pixels.

The image sensor 100 may be employed in a digital image processor with an AF function. With increasing demand for high-quality image acquisition, the digital image processors with an AF function has been applied to digital cameras, smart phones, and cameras for small mobile devices. The digital image processor may decide the position of an imaging lens (not illustrated) using a phase difference detected from the pair of pixels AF1 and AF2 of the image sensor 100 based on light incident through the imaging lens, and control focus.

The AF pixels 20 of the image sensor 100 may have a shield region formed therein. In an embodiment, one AF pixel 20 may have dual microlenses formed therein, and one of the dual microlenses may serve as a shield depending on the incident angle of light. The AF pixel 20 of the image sensor 100, which has dual microlenses, will be described as follows.

Figure 2:
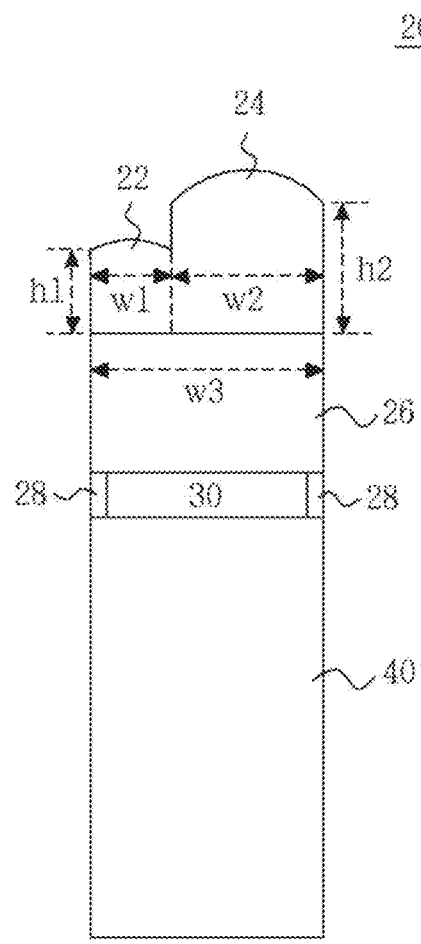
FIG. 2 is a cross-sectional view of an AF pixel of the image sensor of FIG. 1 in accordance with an embodiment.

FIG. 2 is a cross-sectional view of the AF pixel 20 of the image sensor 100 in accordance with an embodiment.

Referring to FIG. 2, each of the AF pixels 20 of the image sensor 100 may include first and second microlenses 22 and 24, a color filter layer 26, a dielectric layer 30, a grid structure 28, and a photoelectric conversion layer 40.

The first and second microlenses 22 and 24 may be arranged on the color filter layer 26 and in parallel to the width (w3) direction of the color filter layer 26 in an AF pixel 20. For example, plane-convex lenses may be used as the first and second microlenses 22 and 24.

Figure 5:
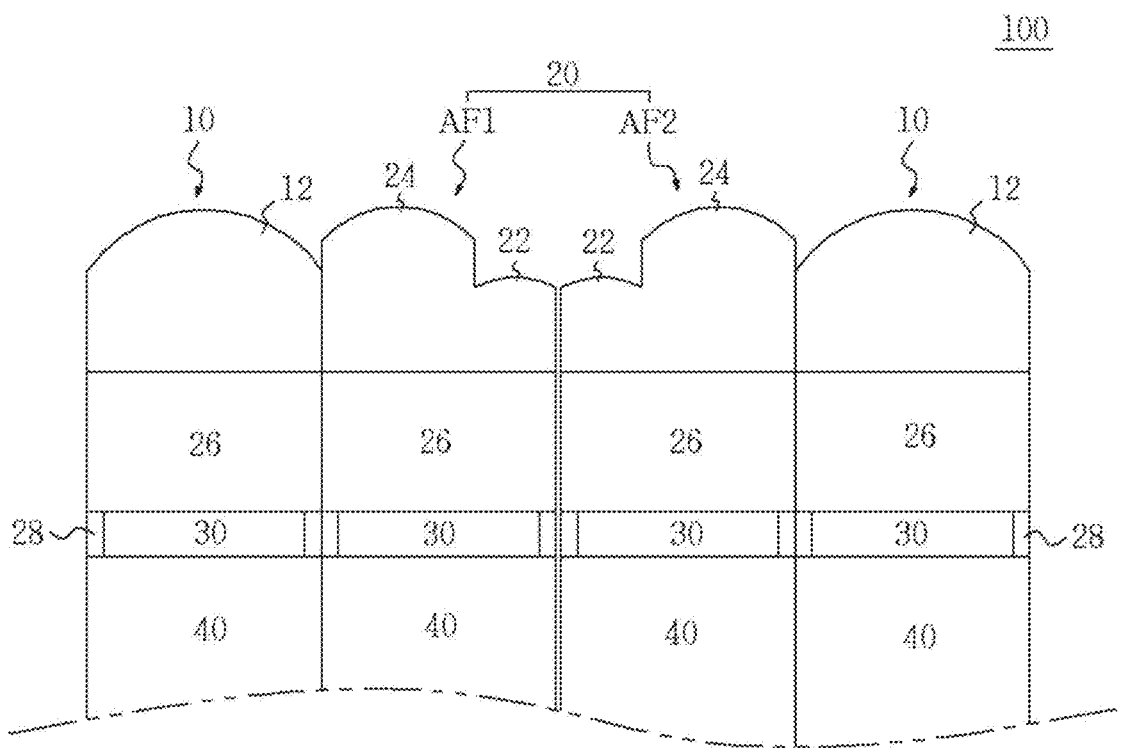
FIG. 5 illustrates a pair of AF pixels of the image sensor in accordance with an embodiment.

The first and second microlenses 22 and 24 may have different heights h1 and h2. One of the first and second microlenses 22 and 24 may have a smaller (i.e., shorter) height than the height of any of the microlenses 12 pix of the image capture pixels 10, as shown in FIG. 5.

The first and second microlenses 22 and 24 may have different radiuses of curvature. Each of the first and second microlenses 22 and 24 may have a smaller radius of curvature than the radius of curvature of any of the microlenses 12 of the image capture pixels 10.

The first and second microlenses 22 and 24 may have different widths. Each of the first and second microlenses 22 and 24 may have a smaller (i.e., shorter) width w1 and w2 than the width w3 of the color filter layer 26.

Thus, the first and second microlenses 22 and 24 may have different heights h1 and h2, different widths w1 and w2, and different radiuses of curvature.

FIG. 2 illustrates that, of the two microlenses 22 and 24, the first microlens 22 has a smaller height, width, and radius of curvature. As so configured, when light is incident in the direction of the first microlens 22, the first microlens 22 may serve as a light shield.

In the embodiment of FIG. 2, the first microlens 22 may be disposed at the left side of the second microlens 24. Thus, when light is incident at a negative angle with respect to the axis of the pixel, the first microlens 22 may serve as a light shield. On the other hand, the first microlens 22 may be disposed at the right side of the second microlens 24. In this case, when light is incident at a positive angle with respect to the axis of the pixel, the first microlens 22 may serve as a light shield.

The color filter layer 26 may be disposed under the first and second microlenses 22 and 24. The color filter layer 26 may separate a specific wavelength of light from received light, and transfer the separated light. The color filter layer 26 may include a red, green, or blue filter. For example, the red filter may separate only light having a wavelength corresponding to red color from the received light, and transfer the separated light. The green filter may separate only light having a wavelength corresponding to green color from the received light, and transfer the separated light. The blue filter may separate only a light having a wavelength corresponding to blue color from the received light, and transfer the separated light.

Thus, an AF pixel 20 may be configured with any one of the red, green, and blue color filters and applied to the corresponding group of red, green, and blue pixels. The image sensor 100 illustrated in FIG. 1 has a structure in which the AF pixel 20 is applied to green pixels, but as described above the invention is not limited thereto.

The dielectric layer 30 may be disposed under the color filter layer 26. The dielectric layer 30 may transfer a specific wavelength of light separated through the color filter layer 26 to the photoelectric conversion layer 40. The dielectric layer 30 may be formed of a dielectric substance which improves the light absorption rate while lowering the reflectance.

The grid structure 28 may be disposed at side surfaces of the dielectric layer 30 to surround the dielectric layer 30. The grid structure 28 may serve to isolate the AF pixel 20 from adjacent pixels such that the light transferred through the dielectric layer 30 has no influence on the adjacent pixels. Since the grid structure 28 serves to isolate the dielectric layer 30 of the AF pixel 20 from the adjacent pixels, the grid structure 28 can reduce crosstalk which may have an influence on the pixels when the phase of incident light is detected. For example, the grid structure 28 may be formed of a metal or a complex structure of metal and dielectric substance.

The photoelectric conversion layer 40 may be disposed under the grid structure 28 and the dielectric layer 30. The photoelectric conversion layer 40 may serve to generate and store electric charges in proportion to the amount of light transferred through the dielectric layer 30. For example, the photoelectric conversion layer 40 may include a photodiode, a photo transistor, a photo gate, a pinned photo diode and/or combinations thereof, in order to generate and store electric charges proportional to the amount of light.

As such, the first and second microlenses 22 and 24 having different heights, widths, and radiuses of curvature may be arranged in parallel to each other in an AF pixel 20. With this configuration, the AF pixel 20 of the image sensor 100 may be used to detect a phase corresponding to incident light.

FIGS. 3A, 3B, 4A, and 4B are diagrams for describing a light reception characteristic based on an incident angle of light.

Figure 3A:
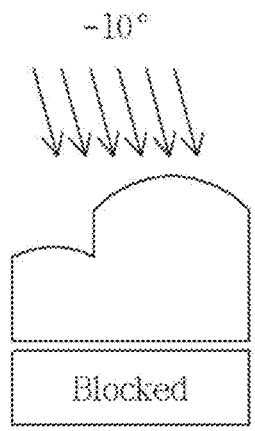
FIGS. 3A and 3B and FIGS. 4A and 4B are exemplary diagrams for describing light reception characteristics based on an incident angle of light.
Figure 3B:
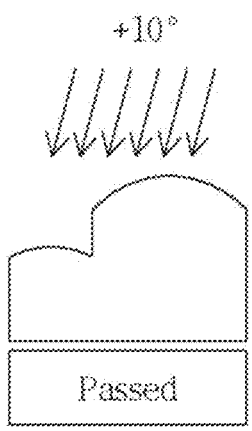
Figure 4A:
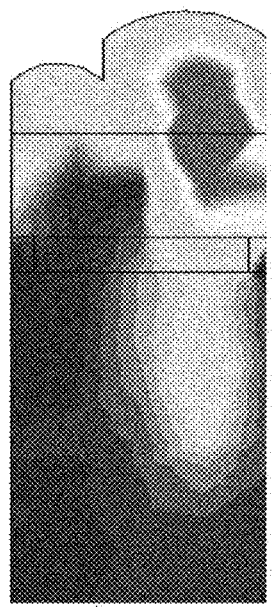
Figure 4B:
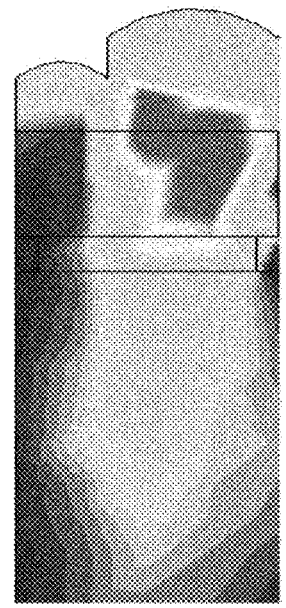

FIGS. 3A, 3B, 4A, and 4B illustrate the AF pixel 20 in which the first microlens 22 having a relatively small height, width, and radius of curvature than that of the second microlens 24 is disposed at the left side of the second microlens 24. FIGS. 3A and 4A are diagrams for describing a light reception characteristic when the incident angle of light is −10°, and FIGS. 3B and 4B are diagrams for describing a light reception characteristic when the incident angle of light is +10°.

As illustrated in FIGS. 3A, 3B, 4A, and 4B, the AF pixel 20 of the image sensor 100 may have a relatively low light reception characteristic when light is incident in the direction of the first microlens 22 and have a relatively high light reception characteristic when light is incident in the direction of the second microlens 24. In the embodiments illustrated in FIGS. 3A, 3B, 4A, and 4B, of the two microlenses 22 and 24, the first microlens 22 has the smaller height, width, and radius of curvature.

With this configuration, when the first microlens 22 is disposed at the left side of the second microlens 24, the AF pixel 20 may have a relatively low light reception characteristic when light is incident at a negative angle with respect to the axis of the pixel, and have a relatively high light reception characteristic when light is incident at a positive angle with respect to the axis of the pixel. On the other hand, when the first microlens 22 is disposed at the right side of the second microlens 24, the AF pixel 20 may have a relatively high light reception characteristic when light is incident at a negative angle, and have a relatively low light reception characteristic when light is incident at a positive angle.

The image sensor in accordance with an embodiment may detect a phase difference using the light reception characteristic depending on the incident angle of light. When light is incident in the direction of the first microlens 22 having a relatively small height and radius of curvature, the first microlens 22 having a relatively low light reception characteristic may serve as a light shield. Therefore, the AF pixel 20 of the image sensor 100 may detect a phase difference using the light reception characteristic.

FIG. 5 illustrates AF pixels 20 (i.e., a pair of AF pixels AF1 and AF2) of the image sensor 100 in accordance with an embodiment.

Referring to FIG. 5, the image sensor 100 may include the pair of AF pixels AF1 and AF2 and image capture pixels 10. Each of the pair of pixels AF1 and AF2 may include first and second microlenses 22 and 24, a color filter layer 26, a dielectric layer 30, a grid structure 28, and a photoelectric conversion layer 40.

In each of the pair of pixels AF1 and AF2, the first and second microlenses 22 and 24 may have different heights, widths, and radiuses of curvature, respectively, and the first and second microlenses 22 and 24 of the pixel AF1 may be arranged symmetrically with respect to the first and second microlenses 22 and 24 of the pixel AF2, as shown in FIG. 5.

Continuing to refer to FIG. 5, along with FIG. 2, in each of the pair of pixels AF1 and AF2 the first and second microlenses 22 and 24 may be arranged in parallel to the width (w3) direction of the color filter layer 26. The first and second microlenses 22 and 24 may have different heights h1 and h2. For example, the first microlens 22 may have a smaller height than the second microlens 24, which may have the same height as the microlens 12 of the image capture pixel 10.

The first and second microlenses 22 and 24 may have different radiuses of curvature. For example, the first microlens 22 may have a smaller radius of curvature than the second microlens 24, and the second microlens 24 may have a smaller radius of curvature than the microlens 12 of the image capture pixel 10.

The first and second microlenses 22 and 24 may have different widths. For example, the width (w1) of the first microlens 22 may be smaller than the width (w2) of second microlens 24, and the width (w2) of the second microlens 24 may be smaller than the width (w3) of the color filter layer 26.

As described above, each of the pair of pixels AF1 and AF2 may include the first and second microlenses 22 and 24 which have different heights, widths, and radiuses of curvature and are arranged in parallel to the widthwise direction of the color filter layer 26, and the first and second microlenses 22 and 24 of the pixel AF1 may be arranged symmetrically with respect to the first and second microlenses 22 and 24 of the AF pixel AF2. The photocurrent characteristics of the pair of pixels AF1 and AF2 will be described as follows.

Figure 6:
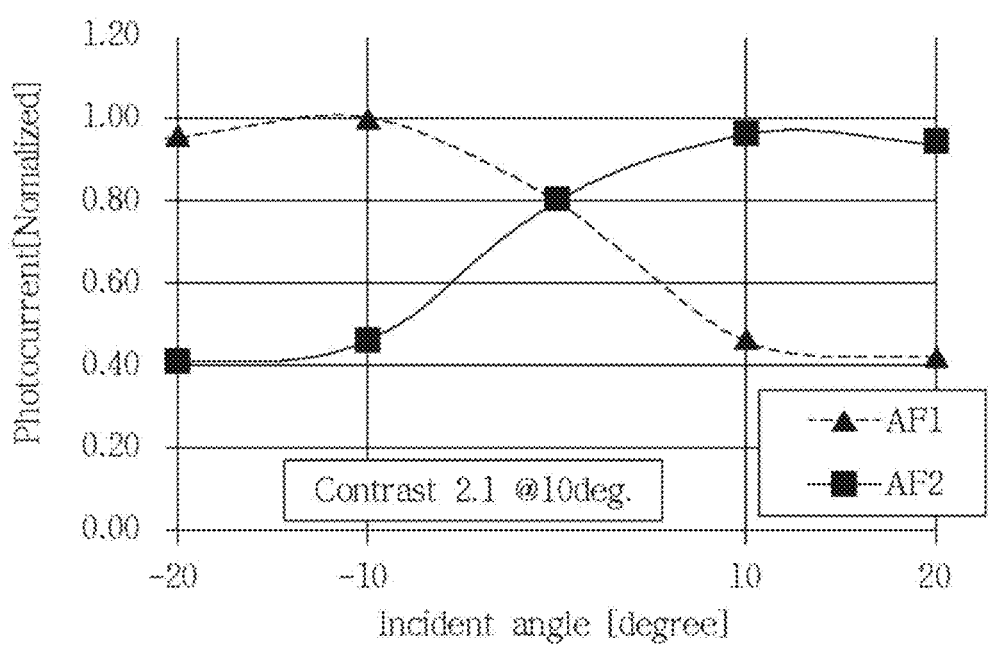
FIG. 6 is a graph illustrating a photocurrent characteristic depending on an incident angle of light in the pair of AF pixels in FIG. 5.

FIG. 6 is a graph illustrating the photocurrent characteristics of the pair of AF pixels (pixel AF1 and pixel AF2) depending on the incident angle of light in FIG. 5.

Referring to FIGS. 5 and 6, when light is incident at an angle of 0° to −20°, the pixel AF1 may have a higher photocurrent than the pixel AF2. On the other hand, when light is incident at an angle of 0° to 20°, the pixel AF2 may have a higher photocurrent than the pixel AF1.

When light is incident in the direction of the first microlens 22 having a relatively small height and radius of curvature, that first microlens 22 may serve as a light shield. Therefore, when light is incident at an angle of 0° to −20°, the first microlens 22 of the AF pixel AF2 may serve as a light shield, and when light is incident at an angle of 0° to 20°, the first microlens 22 of the AF pixel AF1 may serve as a light shield.

Using the photocurrent characteristics depending on the incident angle of light, the image sensor may detect a phase difference from the pair of pixels AF1 and AF2. The digital image processor (not illustrated) may determine the position of the imaging lens using the phase difference detected from the pixels AF1 and AF2, and control focus.

Figures 7, 8:
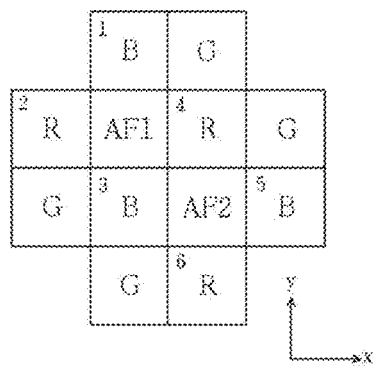
FIG. 7 illustrates an array of partial pixels in the image sensor.
FIG. 8 is a table showing results obtained by measuring crosstalk, which has an influence on image capture pixels around AF pixels as illustrated in FIG. 7.

FIG. 7 illustrates an array of some pixels in the image sensor, and FIG. 8 is a table showing results obtained by measuring crosstalk which has an influence on image capture pixels around AF pixels as illustrated in FIG. 7.

Light absorbed from around the pixels AF1 and AF2 may have an influence on the performance of the pixels due to crosstalk. For example, when light with a wavelength of 540 nm is incident at an angle of −20° to 20° with respect to the x- and y-axis directions, the average crosstalk of the surrounding pixels #1 to #6 of the pixels AF1 and AF2 may be measured as shown in FIG. 8.

Referring to FIG. 8, the image sensor may include only a grid structure (Wgrid only) or include a grid structure and deep trench isolation (Wgrid+DTI). When light is incident at an angle of −20° to 20° with respect to the x- and y-axis directions, the average crosstalk of the pixels surrounding the pixels AF1 and AF2 with dual microlenses is smaller than that of the pixels surrounding the pixels AF1 and AF2 with a metal shield. This indicates that the AF pixels with dual microlenses can be efficiently used for small pixels, which cannot include a structure such as DTI that degrades an optical characteristic by reducing the area of a light receiving unit, as compared to the AF pixels with a metal shield.

In embodiments, an image sensor having the grid structure 28 has been described by way of example. However, the present embodiment may be applied to an image sensor having a grid structure and DTI. The DTI for isolation from adjacent pixels may be arranged on the grid structure, and disposed at the side surfaces of the color filter layer to surround the side surfaces of the color filter layer.

Figure 9:
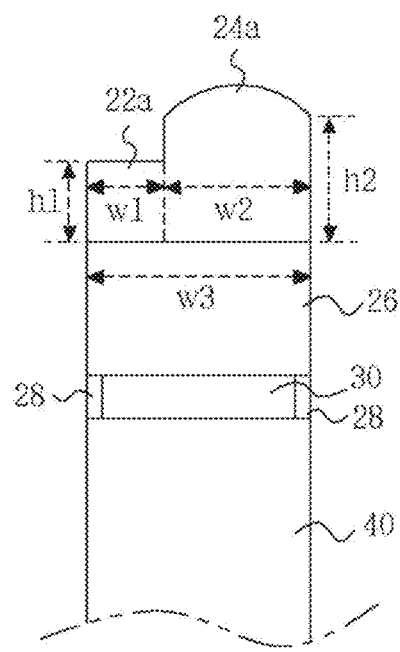
FIG. 9 is a cross-sectional view of an AF pixel of an image sensor in accordance with another embodiment.

FIG. 9 is a cross-sectional view of the AF pixel 20 of the image sensor 100 in accordance with another embodiment.

Referring to FIG. 9, each of the AF pixels 20 of the image sensor 100 illustrated in FIG. 1 may include a receiving layer 22a, a microlens 24a, a color filter layer 26, a dielectric layer 30, a grid structure 28, and a photoelectric conversion layer 40.

The receiving layer 22a and the microlens 24a may be arranged over the color filter layer 26, and arranged in parallel to each other in the width (w3) direction of the color filter layer 26 in an AF pixel 20. The receiving layer 22a may have a flat top surface. For example, the receiving layer 22a may receive incident light through the flat top surface, and the microlens 24a may condense light using a plane-convex lens.

The receiving layer 22a and the microlens 24a may have different heights h1 and h2. the receiving layer 22a may have a smaller height than the microlens 24a and the microlenses 12 (FIG. 5) of the image capture pixels 10.

The receiving layer 22a may have a flat top surface, and the microlens 24a may have a smaller radius of curvature than the microlenses 12 of the image capture pixels 10.

The receiving layer 22a and the microlens 24a may have different widths. The receiving layer 22a and the microlens 24a may have smaller widths w1 and w2 respectively than the width w3 of the color filter layer 26.

Thus, the receiving layer 22a and the microlens 24a may have different heights h1 and h2 and different widths w1 and w2. When light is incident in the direction of the receiving layer 22a, the receiving layer 22a may serve as a shield layer because the receiving layer 22a condenses a smaller amount of light. In FIG. 9, since the receiving layer 22a is disposed at the left side of the microlens 24a, the receiving layer 22a may serve as a shield layer when light is incident at a negative angle.

The color filter layer 26 may be disposed under the receiving layer 22a and the microlens 24a, separate a specific wavelength of light, and transfer the separated light.

The dielectric layer 30 may be disposed under the color filter layer 26, and transfer the specific wavelength of light separated through the color filter layer 26 to the photoelectric conversion layer 40.

The grid structure 28 may be disposed at side surfaces of the dielectric layer 30 to surround the dielectric layer 30. The grid structure 28 can reduce crosstalk between the pixels because the grid structure 28 isolates the dielectric layer 30 of the AF pixel 20 from the adjacent pixels. The grid structure 28 may be formed of a metal or a complex structure of metal and dielectric substance.

The photoelectric conversion layer 40 may be disposed under the grid structure 28 and the dielectric layer 30. The photoelectric conversion layer 40 may serve to generate and store photocharges in proportion to the amount of light transferred through the dielectric layer 30.

Figure 10:
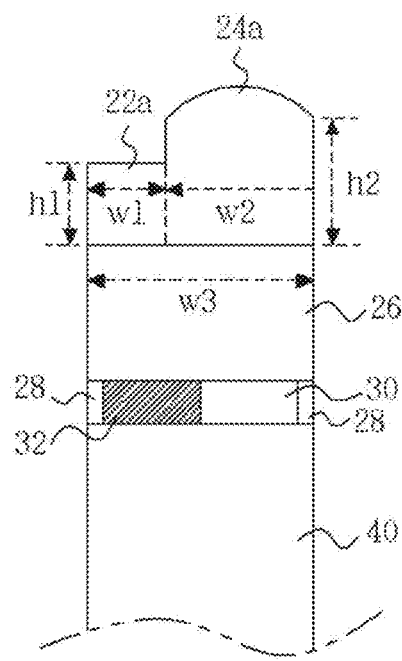
FIG. 10 is a cross-sectional view of an AF pixel of an image sensor in accordance with still another embodiment.

FIG. 10 is a cross-sectional view of the AF pixel 20 of the image sensor 100 in accordance with still another embodiment. The description of like components of the present embodiment and the other embodiments is omitted below.

Referring to FIG. 10, each of the AF pixels 20 of the image sensor 100 illustrated in FIG. 1 may include a receiving layer 22a, a microlens 24a, a color filter layer 26, a dielectric layer 30, a grid structure 28, and a photoelectric conversion layer 40. The image sensor 100 may further include a metal shield 32 under the color filter layer 26 corresponding to the receiving layer 22a.

The metal shield 32 is disposed under the color filter layer 26 corresponding to the position of the receiving layer 22a, and the dielectric layer 30 is disposed under the color filter layer 26 corresponding to the position of the microlens 24a. For example, the metal shield 32 and the dielectric layer 30 may occupy respective halves of the AF pixel at the same level.

The metal shield 32 and the receiving layer 22a may serve as shield layers depending on an incident angle of light. For example, when light is incident in the direction of the metal shield 32 and the receiving layer 22a, the receiving layer 22a may serve as a shield layer because the receiving layer 22a condenses a smaller amount of light than the microlens 24a, and the metal shield 32 blocks light.

The grid structure 28 may be disposed at side surfaces of the dielectric layer 30 and side surfaces of the metal shield 32 to surround the dielectric layer 30 and the metal shield 32 from the side surfaces.

The photoelectric conversion layer 40 may be disposed under the dielectric layer 30, the metal shield 32 and the grid structure 28.

In accordance with embodiments, each of the AF pixels of the image sensor may include the dual microlenses capable of reducing optical loss when the phase of incident light is detected. Therefore, such image sensor can reliably detect a phase difference. Furthermore, since optical loss can be reduced during the phase detection, the image sensor can improve an AF success rate even when the image sensor is applied to a high-resolution camera module with a small light receiving area.

Although various embodiments have been described for illustrative purposes, it will be apparent to those skilled in the art in light of the foregoing description that various changes and modifications may be made without departing from the spirit and scope of the invention as defined in the following claims.

What is claimed is:

1. An image sensor comprising a pixel array in which auto-focus (AF) pixels and image capture pixels are arranged,
wherein at least one of the AF pixels comprises:
a color filter layer; and
first and second microlenses arranged over the color filter layer, and formed in a region of the at least one AF pixel in a widthwise direction of the color filter layer,
wherein the at least one AF pixel comprises a pair of AF pixels for detecting a phase difference,
the first and second microlenses of one AF pixel of the pair of AF pixels are formed symmetrically with respect to the first and second microlenses of the other AF pixel of the pair of AF pixels.

2. The image sensor of claim 1, wherein the first and second microlenses are plane-convex lenses having different heights.

3. The image sensor of claim 2, wherein one of the first, and second microlenses has a smaller height than a microlens of at least one of the image capture pixels.

4. The image sensor of claim 1, wherein the first and second microlenses are plane-convex lenses having different radiuses of curvature.

5. The image sensor of claim 4, wherein the first microlens has a smaller radius of curvature than the second microlens, and the second microlens has a smaller radius of curvature than a microlens of at least one of the Image capture pixels.

6. The image sensor of claim 1, wherein the first and second microlenses have different heights, different widths, and different radiuses of curvature.

7. The image sensor of claim 6, wherein the first microlens has a smaller width than the second microlens, and the sum of the widths of the first and second microlenses is equal to the width of the color filter layer.

8. The image sensor of claim 6, wherein one of the first and second microlenses has a smaller height than a microlens of at least one of the image capture pixels, and the first and second microlenses have different radiuses of curvature, each being smaller than a radius of curvature of the microlens of the at least one image capture pixel.

9. The image sensor of claim 1, wherein the at least one AF pixel further comprises:
a dielectric layer disposed under the color filter layer;
a grid structure disposed at side surfaces of the dielectric layer to surround the dielectric layer; and
a photoelectric conversion layer disposed under the dielectric layer and the grid structure.

10. An image sensor comprising a pixel array in which auto-focus (AF) pixels and image capture pixels are arranged,
wherein at least one of the AF pixels comprises:
a color filter layer; and
a receiving layer and a microlens arranged over the color filter layer, and formed in a region of the at least one AF pixel in the widthwise direction of the color filter layer,
wherein the at least one AF pixel comprises a pair of AF pixels for detecting a phase difference,
the receiving layer and the microlens of one AF pixel of the pair of AF pixels are formed symmetrically with respect to the receiving layer and the microlens of the other AF pixel of the pair of AF pixels.

11. The image sensor of claim 10, wherein the microlens is a plane-convex lens, and the receiving layer and the microlens have different heights.

12. The image sensor of claim 11, wherein the receiving layer has a smaller height than the microlens.

13. The image sensor of claim 10, wherein the receiving layer has a smaller width than the microlens, and the sum of the widths of the receiving layer and the microlens is equal to the width of the color filter layer.

14. The image sensor of claim 10, wherein the microlens has a smaller radius of curvature than a microlens of at least one of the image capture pixels.

15. The image sensor of claim 10, wherein the at least one AF pixel further comprises a metal shield disposed under the color filter layer, the metal shield corresponding to the receiving layer.

16. The image sensor of claim 15, wherein the at least one AF pixel further comprises:
a dielectric layer formed at a same level as the metal shield, and disposed under the color filter layer, the dielectric layer corresponding to the microlens;
a grid structure disposed at side surfaces of the dielectric layer and the metal shield to surround the dielectric layer and the metal shield; and
a photoelectric conversion layer disposed under the dielectric layer and the grid structure.

17. The image sensor of claim 10, wherein the receiving layer has a flat top surface.

18. An image sensor comprising a pixel array in which auto-focus (AF) pixels and image capture pixels are arranged,
wherein at least one of the AF pixels comprises:
a color filter layer; and
first and second light-incident layers arranged over the color filter layer,
wherein the first and second light-incident layers have different heights and different widths,
wherein the at least one AF pixel comprises a pair of AF pixels for detecting a phase difference,
the first and second light-incident layers of one AF pixel of the pair of AF pixels are formed symmetrically with respect to the first and second light-incident layers of the other AF pixel of the pair of AF pixels.

19. The image sensor of claim 18, wherein the first light-incident layer has a shorter height than the second light-incident layer, and the first light-incident layer has a shorter width than the second light-incident layer.

* * * * *